(12) United States Patent
Weiss et al.

(10) Patent No.: US 11,139,800 B1
(45) Date of Patent: Oct. 5, 2021

(54) OPTIMIZED MULTI-PAM FINITE IMPULSE RESPONSE (FIR) FILTER

(71) Applicant: Aquantia Corporation, San Jose, CA (US)

(72) Inventors: Oliver Weiss, Kaarst (DE); Martin Broich, Aachen (DE)

(73) Assignee: Marvell Asia Pte, Ltd., Singapore (SG)

( * ) Notice: Subject to any disclaimer, the term of this patent is extended or adjusted under 35 U.S.C. 154(b) by 215 days.

(21) Appl. No.: 16/419,625

(22) Filed: May 22, 2019

Related U.S. Application Data

(60) Provisional application No. 62/676,001, filed on May 24, 2018.

(51) Int. Cl.
*H03H 21/00* (2006.01)
*H03H 17/02* (2006.01)
*H03H 17/00* (2006.01)

(52) U.S. Cl.
CPC .... *H03H 21/0025* (2013.01); *H03H 17/0255* (2013.01); *H03H 2017/0081* (2013.01)

(58) Field of Classification Search
CPC ............................ H03H 17/06; H03H 17/0235
See application file for complete search history.

(56) References Cited

U.S. PATENT DOCUMENTS

| | | | | |
|---|---|---|---|---|
| 6,163,788 A * | 12/2000 | Chen | ............ | G06F 17/10 708/319 |
| 7,167,514 B2 * | 1/2007 | McElroy | ............ | G06F 7/4824 375/229 |
| 7,945,610 B2 * | 5/2011 | Takahashi | ............ | G06F 17/15 708/319 |
| 2005/0070228 A1 * | 3/2005 | Hara | ............ | H04B 3/23 455/63.1 |
| 2005/0094723 A1 * | 5/2005 | Takatori | ............ | H03H 21/0012 375/232 |
| 2018/0183629 A1 * | 6/2018 | Pandey | ............ | H04L 25/03885 |

\* cited by examiner

*Primary Examiner* — Chuong D Ngo

(57) ABSTRACT

A receiver circuit is disclosed. The receiver circuit includes a multi-PAM input circuit to receive a multi-PAM input symbol. The input symbol exhibits one of multiple threshold levels during a sampling period. The threshold levels correspond to a set of M-bit two's-complement values within a defined set of threshold values. An adaptive filtering circuit includes a first transcoder to transcode the set of M-bit two's-complement values to a set of N-bit values, where N<M. An adaptive filter operates to filter the set of N-bit values to generate a filtered set of data values. A second transcoder transforms the filtered set of data values to a second set of data values that corresponds to a set of filtered M-bit two's-complement values.

15 Claims, 3 Drawing Sheets

OPTIMIZED MULTI-PAM FINITE IMPULSE RESPONSE (FIR) FILTER

RELATED APPLICATION(S)

This application claims benefit of priority to Provisional U.S. Patent Application No. 62/676,001, titled "PAM4 FINITE IMPULSE RESPONSE (FIR) METHOD AND APPARATUS", filed May 24, 2018, the aforementioned priority application being hereby incorporated by reference in its entirety.

TECHNICAL FIELD

The disclosure herein relates to digital signal processing systems, and more specifically to non-recursive adaptive filter architectures and associated filtering methods.

BACKGROUND

Pulse Amplitude Modulation (PAM) signaling schemes provide an efficient way to express multi-bit symbols during sampling operations. PAM4 symbols generally exhibit one of four possible threshold values (−3, −1, +1, +3), expressed as a 3-bit twos-complement number. Conventional adaptive filtering techniques to filter the 3-bit symbol values generally become more complex as the number of input symbol bits increase.

FIG. 1 illustrates a conventional 3-tap finite impulse response (FIR) filter that receives a sampled 3-bit threshold value from a PAM4 input symbol stream $x_k$. The filter includes a plurality of delay elements 102 and 104, for delaying previously sampled data from the symbol stream. A number of taps $C_0$-$C_2$ are respectively coupled to the input symbol stream and each of the delay output nodes. The taps receive respective weights or coefficients $W_{coeff}$ that represent gain factors applied to a sequence of data samples in a weighted manner. A summing circuit 106 receives the weighted samples from the taps, averages them, and outputs a filtered value $y_k$.

With ever-increasing data rates and circuit integration, employing parallel arrays of adaptive filters, each with "N" taps in parallel creates an increasingly complex circuit with a corresponding level of required computing overhead that not only impacts the circuit footprint, but also its power parameters. It would be desirable to address such issues without overly complex circuitry.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of receiver circuits, adaptive filters, and associated methods are disclosed. For one embodiment, a receiver circuit includes a multi-PAM input circuit to receive a multi-PAM input symbol. The input symbol exhibits one of multiple threshold levels during a sampling period. The threshold levels correspond to a set of M-bit two's-complement values within a defined set of threshold values. An adaptive filtering circuit includes a first transcoder to transcode the set of M-bit two's-complement values to a set of N-bit values, where N<M. An adaptive filter operates to filter the set of N-bit values to generate a filtered set of data values. A second transcoder transforms the filtered set of data values to a second set of data values that correspond to a set of filtered M-bit two's-complement values. By employing the transcoder, the adaptive filter circuitry may operate with a significantly lower level of circuit complexity.

Figure 2:
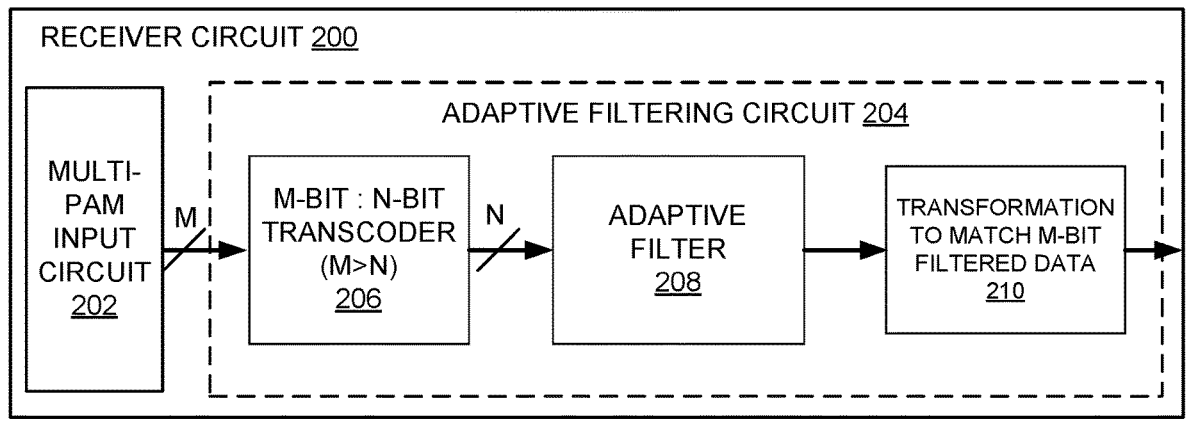
FIG. 2 illustrates one embodiment of a receiver circuit that employs an optimized filtering circuit.

FIG. 2 illustrates one embodiment of a receiver circuit 200 that includes a multi-PAM input circuit 202 and an adaptive filtering circuit 204. The multi-PAM input circuit 202 generally receives an input symbol stream, such as a PAM4 symbol stream, and samples the symbols to generate an M-bit stream of values. For a PAM4 receiver, each symbol generally exhibits a voltage level that falls within one of four voltage ranges. Each voltage range corresponds to a multi-bit sequence. When encoded in a two's-complement manner, each multi-bit value is a three-bit value from the set of values including (−3, −1, +1, +3). Once sampled and converted to digital form, the 3-bit values (where M=3) are fed to the adaptive filtering circuit 204.

Further referring to FIG. 2, one embodiment of the adaptive filtering circuit 204 includes a first transcoder 206 that recodes the M-bit value (such as a 3-bit value), into a reduced-bit value N (such as a 2-bit value). For one specific embodiment, the first transcoder recodes the stream of PAM4 input symbols into a modified stream consistent with the following relationship:

$$\tilde{x}_k = \frac{1}{2} \cdot (x_k - 1)$$

The operation generally removes the least-significant bit (LSB) from the original data and applies a 1-bit right shift to the remaining two bits.

With continued reference to FIG. 2, the resulting 2-bit data stream is then fed into a non-recursive adaptive filter 208, such as a finite impulse response (FIR) filter. The output data of the adaptive filter may be represented by the following relationship:

$$\tilde{y}_k = \sum_{j=0}^{N-1} C_j \cdot \tilde{x}_{k-j} = \frac{1}{2} \cdot \sum_{j=0}^{N-1} C_j \cdot x_{k-j} - \frac{1}{2} \cdot \sum_{j=0}^{N-1} C_j$$

Figure 1:
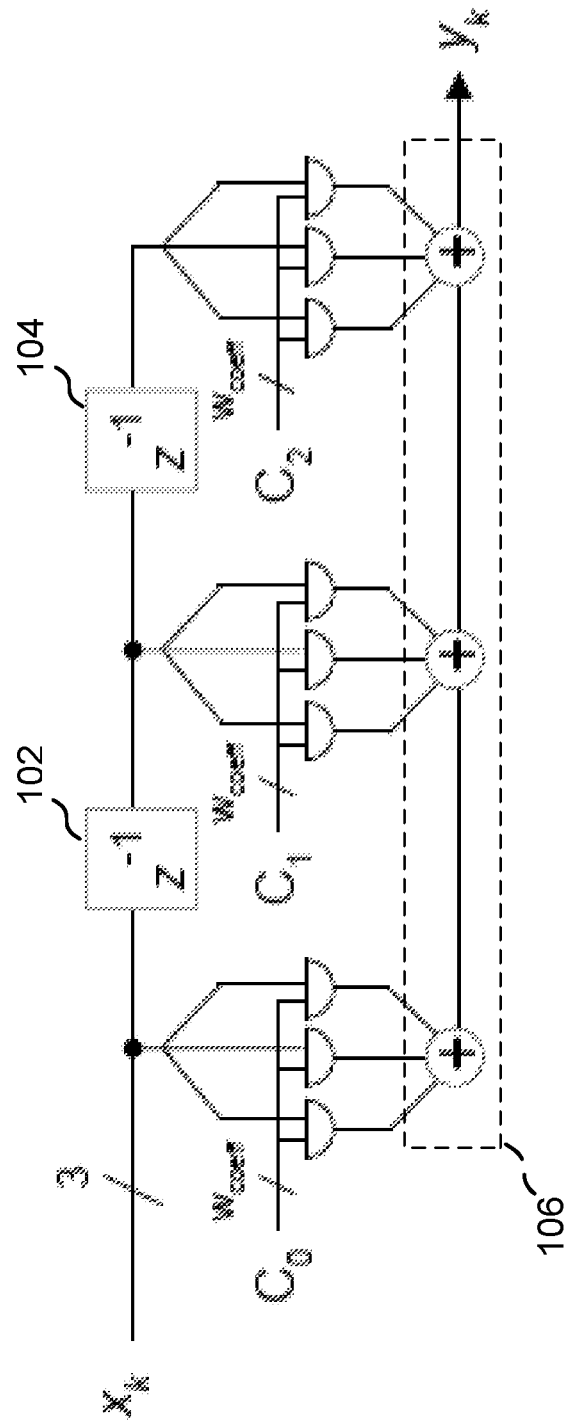
FIG. 1 illustrates a conventional 3-tap FIR filter utilized for a twos-complement 3-bit PAM4 input symbol.

The relationship above may be rewritten to the following relationship that defines the output of a conventional filter circuit, such as the filter circuit 100 of FIG. 1, to be equivalent to the summation of the output of a less complex adaptive filter, such as filter 208, along with a summation circuit to carry out a corrective summation (of all the coefficient values):

$$y_k = 2 \cdot \sum_{j=0}^{N-1} C_j \cdot \tilde{x}_{k-j} + \sum_{j=0}^{N-1} C_j$$

Figure 3:
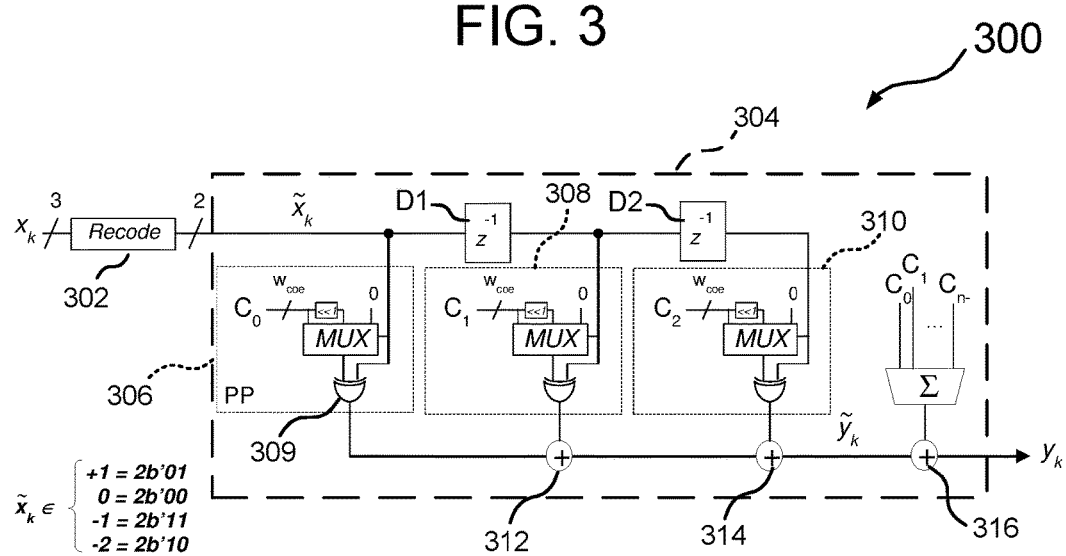
FIG. 3 illustrates further detail of one embodiment of an optimized filtering circuit consistent with the filtering circuit of FIG. 2.

Referring now to FIG. 3, further detail for one specific embodiment of an adaptive filtering circuit 300 is shown. A 3-bit input stream $x_k$ feeds a first transcoder or recoder circuit 302, that recodes the 3-bit two's-complement values to a 2-bit value stream of bits $x_k'$ consistent with the LSB removal and bit shifting discussed above. The 2-bit value stream of bits $x_k'$ is then fed to a finite impulse response (FIR) filter 304 that employs at least three tap circuits 306, 308 and 310. Each tap circuit is disposed at equally spaced delay intervals of a delay line having delay elements D1 and D2. For one specific embodiment, each tap weight circuit includes a multiplexer MUX to receive a tap weight value (such as $C_0$ for tap circuit 304, $C_1$ for circuit 306, etc.). The multiplexer output is then fed to an XOR circuit 309 that applies an XOR operation to the 2-bit data stream to generate a partial product output. Each of the tap circuit partial product outputs are summed, at 312 and 314. A final summation circuit 316 provides a corrective sum of the coefficients to the filtered data bit stream, thereby transforming the filtered data stream back to a data stream corresponding to a data stream that would be achieved via a conventional circuit such at the circuit 100 of FIG. 1.

The adaptive filtering circuit described above lends itself well to the relationship discussed above with regards to the high-level receiver circuit of FIG. 2. Since the set of recoded symbols is limited to {−2, −1, 0, +1}, the multiplication of such a symbol with a coefficient value can be done in a single step leading to a single partial product per coefficient. The sign inversion can be done by the XOR operation, the multiplication by 2, 1, or 0 can be implemented by a MUX selecting the single bit shifted coefficient, the original coefficient, and zero. Finally, the total number of summation operations with the modified difference equation (which is equivalent to the original one still) is 2·n (n for the modified filter operation plus n for the summation of coefficients).

While not shown in FIGS. 2 and 3, the adaptive filtering circuit 300 may often employ identical circuit "slices" that operate in parallel to process data faster. For example, the adaptive filter circuit 300 may be parallelized to a degree of "p", such that the clock rate for each adaptive filter is 1ip the clock rate of the incoming bit stream. With the parallelized circuitry, the relative complexity of the adaptive filter may impact the overall operability of the receiver circuit. Thus, by minimizing the complexity of the adaptive filter, achievable through the unique transcoding method described above, the overall receiver architecture may be optimized. For example, assuming the complexity of the AND operation for doing the partial multiplication in a conventional filter, such as the filter 100, to be $\frac{1}{6}^{th}$ of the summation operation and assuming the complexity of the modified partial product operation in the 2-bit filter 304 to be about half of a summation, the reduction of complexity for the proposed filter structure is >2× for a typical parallelization of 16:

$$\frac{16 \cdot 3 \cdot n \cdot 1\frac{1}{6}}{16 \cdot n \cdot 1\frac{1}{2} + n} = 2.24$$

Figure 4:
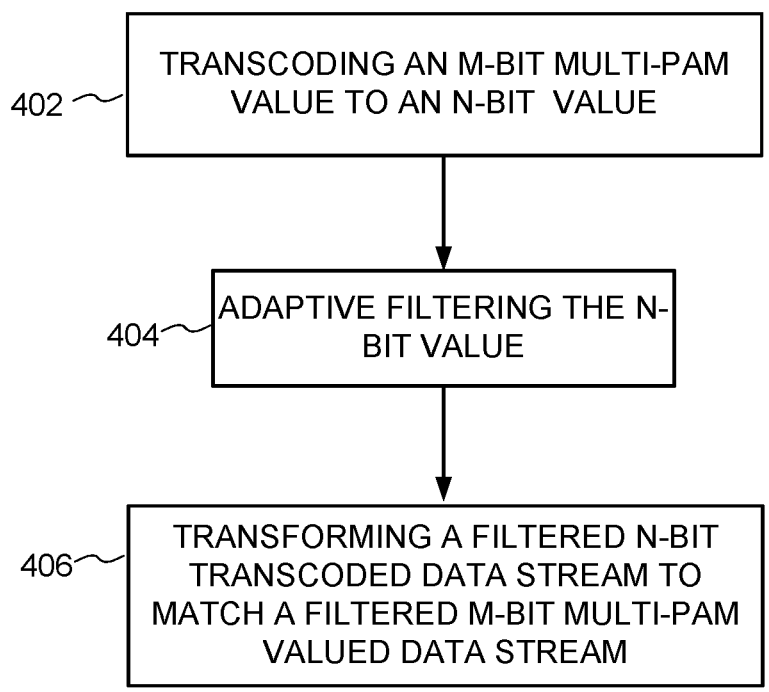
FIG. 4 illustrates a flowchart of a method of operation corresponding to the optimized filtering circuit of FIG. 2.

FIG. 4 illustrates a flow diagram illustrating one embodiment of a method of operation for a receiver circuit, generally designated 400, that is consistent with the systems and circuitry described herein. The method includes first transcoding an M-bit multi-PAM value to an N-bit threshold value, where N<M, at 402. The transcoded value is then adaptively filtered, at step 404. As explained above, for one embodiment, the adaptive filter is optimized such that a reduced number of partial-products are generated internally, enabling a reduced-complexity design. The filtered value is then recoded back to match the output of an M-bit data filtered value, at 406.

Those having skill in the art will appreciate that the embodiments described herein enable the use of a less-complex adaptive filtering circuit to provide filtering for advanced multi-level signaling schemes, such as PAM4. By enabling use of less-complex circuitry, circuit size, power, and computational overhead may be significantly reduced, thereby enhancing the overall circuit operating parameters.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "I" attached to signal names indicates that the signal is an active low signal (i.e., the asserted state is a logic low state). A line over a signal name (e.g., '<u><signalname></u>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A receiver circuit, comprising:
a multi-PAM input circuit configured to receive a multi-PAM input symbol, the input symbol exhibiting a signal level that falls within one of multiple signal ranges during a sampling period, the signal ranges corresponding to a first set of M-bit two's-complement values, the multi-PAM input circuit configured to identify the input symbol signal level and corresponding M-bit two's-complement code corresponding to the identified signal level; and
an adaptive filtering circuit including
a first transcoder to transcode the identified M-bit two's-complement code to an N-bit code representing a value from a set of N-bit two's complement values, wherein N<M;
an adaptive filter to receive the N-bit code and to generate a filtered data value; and
a second transcoder to transform the filtered data value to a second data value that corresponds to a filtered M-bit two's-complement value.

2. The receiver circuit according to claim 1, wherein:
the multi-PAM input circuit comprises a PAM4 input circuit to receive PAM4 input symbols.

3. The receiver circuit according to claim 2, wherein the first set of M-bit two's complement values comprises:
a set of 3-bit two's-complement values corresponding to the set (−3, −1, +1, +3).

4. The receiver circuit according to claim 2, wherein the second set of N-bit two's complement values comprises:
a set of 2-bit two's-complement values corresponding to the set (−2, −1, 0, +1).

5. The receiver circuit according to claim 2, wherein:
the adaptive filter comprises a finite impulse response (FIR) filter.

6. The receiver circuit according to claim 5, wherein:
the adaptive filter includes at least three taps.

7. The receiver circuit according to claim 6, wherein:
each of the at least three taps generates a single partial product; and
the adaptive filter is configured to generate a sum of the single partial products from each of the at least three taps.

8. An adaptive filtering circuit including
a first transcoder to transcode a multi-PAM input symbol encoded in a first M-bit two's-complement value to an N-bit value, wherein N<M;
an adaptive filter to receive the N-bit value and generate a filtered data value; and
a second transcoder to transform the filtered data value to a second data value that corresponds to a filtered M-bit two's-complement value.

9. The adaptive filter circuit according to claim 8, wherein the first M-bit two's complement values comprises:
a 3-bit two's-complement value corresponding to one from the set of values represented by (−3, −1, +1, +3).

10. The adaptive filter circuit according to claim 8, wherein the N-bit value comprises:
a 2-bit value corresponding to one from the set of values represented by (−2, −1, 0, +1).

11. The adaptive filter circuit according to claim 8, embodied as a finite impulse response (FIR) filter.

12. The adaptive filter circuit according to claim 11, further comprising:
at least three taps.

13. The adaptive filter circuit according to claim 12, wherein:
each of the at least three taps generates a single partial product; and
the adaptive filter is configured to generate a sum of the single partial products from each of the at least three taps.

14. A method of operation for a receiver circuit, the method comprising:
receiving a multi-PAM input symbol, the input symbol exhibiting a signal level that falls within one of multiple signal ranges during a sampling period, the signal ranges corresponding to a first set of M-bit two's-complement values;
identifying the input symbol signal level and corresponding M-bit two's-complement code corresponding to the identified signal level; and
adaptively filtering the multi-PAM input symbol, including
transcoding the identified M-bit two's-complement code, with a first transcoder, to an N-bit code representing a value from a set of N-bit two's complement values, wherein N<M;
adaptively filtering the N-bit code to generate a filtered data value; and
recoding the filtered data value to a second data value that corresponds to a filtered M-bit two's-complement value.

15. The method according to claim 14, wherein:
the receiving of the multi-PAM input symbol comprises receiving a PAM4 input symbol.

* * * * *